(12) United States Patent
Sinkunas et al.

(10) Patent No.: US 6,583,385 B1
(45) Date of Patent: Jun. 24, 2003

(54) METHOD FOR SOLDERING SURFACE MOUNT COMPONENTS TO A SUBSTRATE USING A LASER

(75) Inventors: Peter Joseph Sinkunas, Canton, MI (US); Zhong-You (Joe) Shi, Ann Arbor, MI (US); Jay D. Baker, Dearborn, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 33 days.

(21) Appl. No.: 10/028,417

(22) Filed: Dec. 19, 2001

(51) Int. Cl.[7] .................................................. B23K 1/005
(52) U.S. Cl. ............................ 219/121.85; 219/121.64
(58) Field of Search ........................ 219/121.85, 121.64, 219/121.66, 121.8; 228/180.22, 234.1

(56) References Cited

U.S. PATENT DOCUMENTS

| | | | |
|---|---|---|---|
| 4,979,290 A | 12/1990 | Chiba | 219/121.63 |
| 5,164,566 A * | 11/1992 | Spletter et al. | 219/121.63 |
| 5,274,210 A * | 12/1993 | Freedman et al. | 219/121.64 |
| 5,484,979 A * | 1/1996 | Gao | 219/121.64 |
| 5,495,089 A | 2/1996 | Freedman et al. | 219/121.64 |
| 5,763,854 A * | 6/1998 | Dittman et al. | 219/121.63 |
| 5,996,222 A | 12/1999 | Shangguan et al. | |
| 6,168,070 B1 * | 1/2001 | Sinkunas | 219/121.64 |
| 6,284,998 B1 * | 9/2001 | Sinkunas et al. | 219/121.64 |

* cited by examiner

Primary Examiner—Geoffrey S. Evans
(74) Attorney, Agent, or Firm—Brinks Hofer Gilson & Lione

(57) ABSTRACT

A method for reflowing a solder dispersed between a plurality electrical circuit conductor pads attached to a flexible substrate and at least one electronic component using a laser is disclosed. The method includes aligning the plurality of electric circuit conductor pads along a common axis, placing the at least one electronic component having a light colored surface side on a pair of the electrical circuit conductor pads wherein the light colored surface faces the laser, and sweeping the laser across a plurality of electronic components and conductor pads to reflow the solder without damaging the substrate.

18 Claims, 6 Drawing Sheets

US 6,583,385 B1

METHOD FOR SOLDERING SURFACE MOUNT COMPONENTS TO A SUBSTRATE USING A LASER

TECHNICAL FIELD

The present invention relates to systems and methods mounting electronic components to flexible substrates using a laser, wherein the flexible substrates have a low glass transition temperature.

BACKGROUND OF THE INVENTION

Electronic components such as surface mount components may be soldered to printed circuit boards (FR4 or similar material) by reflowing solder paste. Typically a solder paste is printed on the circuit board and then the board is populated with electronic components and other devices. The populated boards are then transferred into a reflow oven and raised to a temperature high enough to liquefy the solder.

Unfortunately, this method of soldering has several drawbacks or limitations. For example, substrates that can tolerate high reflow temperatures and long durations at those temperatures may only be used in this process. For instance, flexible substrates having low glass transition temperatures would be damaged using prior art methods. However, it would be desirable to use lighter and cheaper plastic substrates such as flat flex cables especially in the automotive environment. Unfortunately, these lighter and cheaper plastic substrates and flat flex cable have a much lower glass transition temperature. Thus, if conventional methods for reflowing solder are used with these plastic substrates, the substrates will not survive the process.

Therefore, there is a need for a new and improved system and method for soldering electronic components such as surface mount components to flexible substrates. This new and improved system and method should reflow solder paste to interconnect the electronic components to circuit traces on a flexible substrate. Further, the new and improved system and method should not damage the flat plastic substrate during the reflow process.

BRIEF SUMMARY OF THE INVENTION

In an aspect of the present invention a new and improved method for soldering electronic components to a flexible plastic substrate is provided. A diode laser is utilized to reflow solder paste printed on a plastic substrate. Such substrates that may be used have low glass transition temperatures, for example, PET. Beneficially, these polymer substrates absorb very little of the energy output of the diode laser.

In another aspect of the present invention, a method for using a diode laser to reflow solder on a flexible substrate is provided. This method. advantageously speeds up the soldering process. The process includes flipping the electronic components (such as surface mount components) so that a light colored side of the electronic component faces the diode laser. The laser beam may be rastered across the surface of the substrate so that laser radiation sweeps across a strip (along a common axis) on the populated substrate. In this manner, the solder paste in the laser beams path is reflowed and an electrically connection is achieved between the substrate and the electronic components. Advantageously, the laser beam does not damage the plastic substrate that is exposed to the beam since the substrate's properties are such that minimal laser radiation is absorbed by the substrate. The rastering of the laser beam across the entire substrate surface will greatly reduce process time since the laser controller does not have to go to memory to find the next location, perform calculations, check fiducials, etc. and move to the next component.

The soldering process of the present invention can also be used to solder the surface mount components from the back (underneath) of the substrate because of the transparent nature of the plastic to the laser's output. This will eliminate the spatial interference of the components with the laser beam when soldering from the front (top) side of the substrate. Again, the rastering method can be used in this case.

Further objects, features and advantages of the invention will become apparent from consideration of the following description and the appended claims when taken in connection with the accompanying drawings.

DETAILED DESCRIPTION OF THE INVENTION

Figure 1:
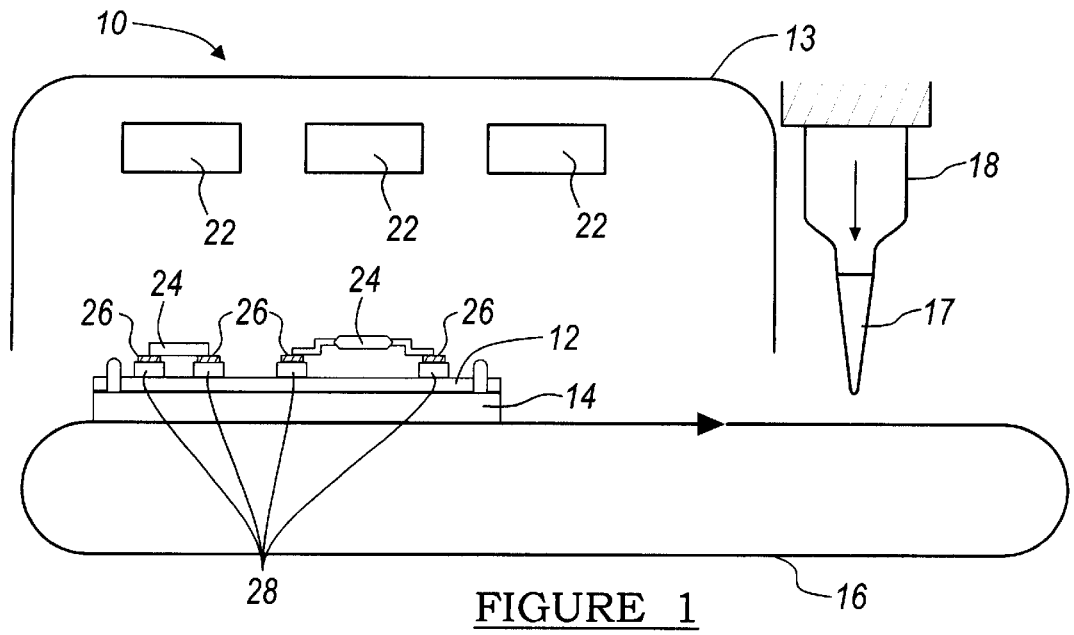
FIG. 1 is a schematic diagram of a system for reflowing solder paste printed on a substrate for electrically interconnecting an electronic component to the substrate, in accordance with the present invention.

A system 10 for reflowing solder to electrically interconnect electronic components to a flexible or semi-flexible substrate 12 is illustrated in FIG. 1, in accordance with the present invention. Further, system 10 includes a pallet 14 that provides a means to support the flexible substrate 12 without degrading the material properties of the substrate. System 10 additionally includes a reflow oven 13, a conveyor system 16, and a supplemental heat source 18. The reflow oven has a plurality of heaters 22 to pre-heat the substrate 12 to a desired preheat temperature. Conveyor system 16 is configured in a conventional manner to cooperatively receive pallets 14 for movement through reflow oven 13 and under supplemental heat source 18.

Pallet 14 is, preferably, a phase-transition pallet for absorbing heat during the solder paste reflow process to interconnect electronic components 24 to flexible substrates 12, in accordance with the present invention. Phase-transition pallet 14 is configured to support substrate 12 and cooperates with conveyor system 16 to transport substrate 12 through oven 13. Oven 13's heaters 22 pre-heat substrate 12. Solder paste 26 is printed on conductor pads 28 disposed on substrate 12 on which components 24 are placed.

Figure 2B:
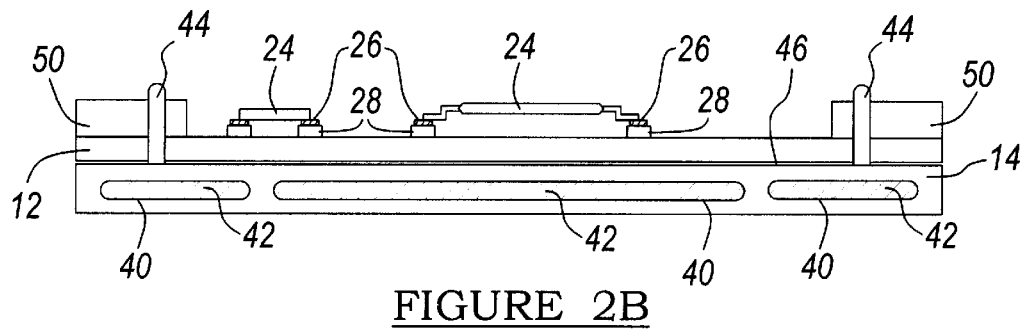
FIGS. 2a–2b is an elevation and cross-sectional views of a phase-transition pallet for use in the system of the present invention.
Figure 2A:
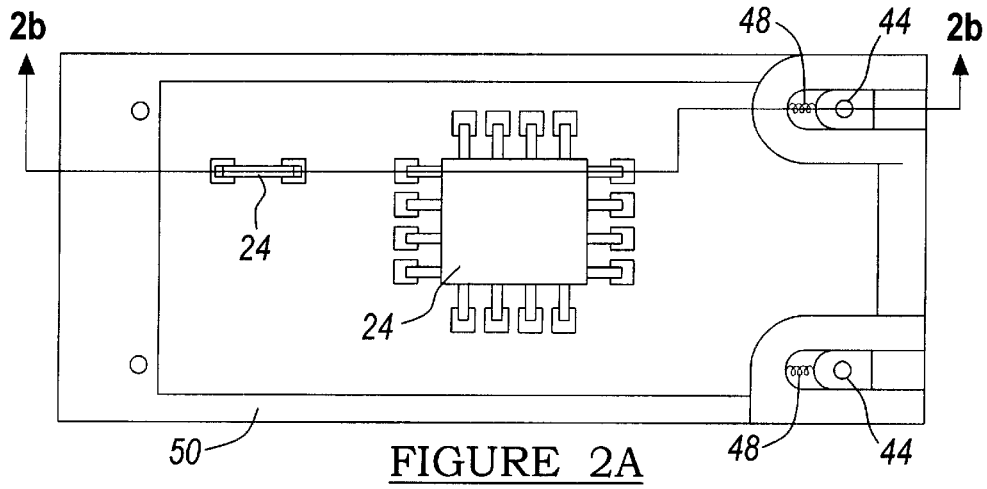
Figure 3A:
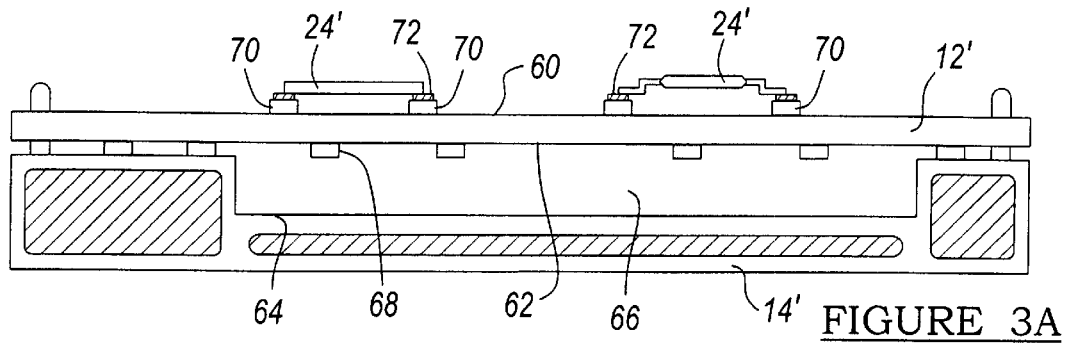
FIGS. 3a–3d are cross-sectional views of the phase-transition pallet having at least one open cavity to accommodate electronic components that have been mounted on a first exposed surface of the substrate, in accordance with the present invention.
Figure 3B:
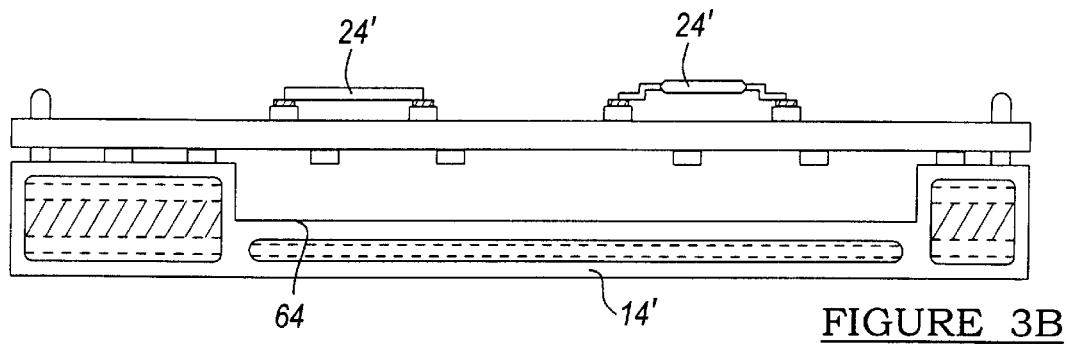
Figure 3C:
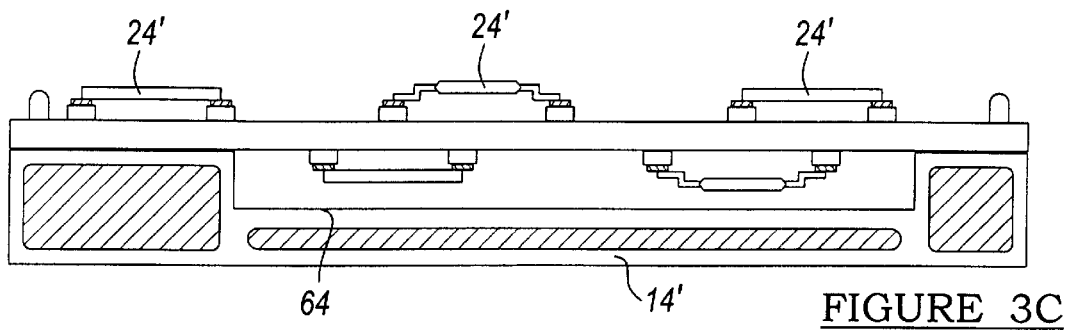
Figure 3D:
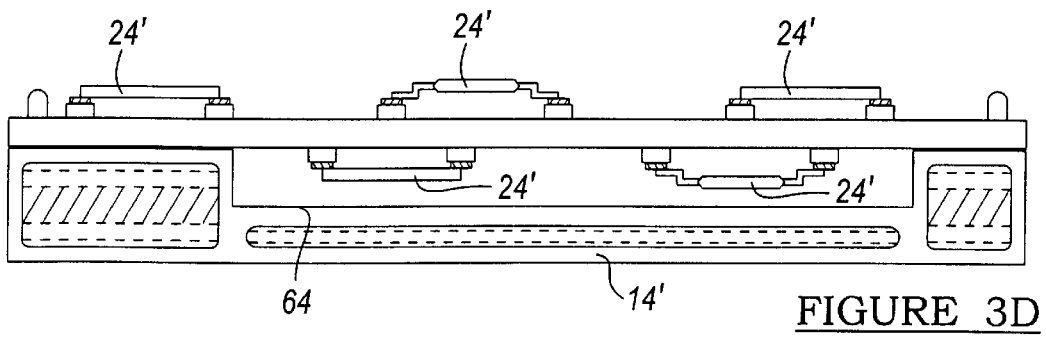

Referring now to FIGS. 2a–2b, an elevation and cross-sectional views of phase-transition pallet 14 are illustrated, in accordance with the present invention. As shown pallet 14 includes at least one internal cavity 40 having therein a phase-change material 42. Support pins 44 are provided on pallet 14 to hold substrate 12 flat or planar on a pallet surface 46. Pins 44 may be tensioned or loaded by springs 48 to provide a tensioning force on substrate 12. In an embodiment of the present invention, a picture frame 50 may be used to secure substrate 12 against pallet surface 46. Picture frame 50, as illustrated attaches to and secures the periphery of substrate 12 to hold the edges of substrate 12 against surface 46 of the pallet.

In another embodiment of the present invention, a phase-transition pallet 14' configured to accommodate a double-sided substrate 12 having electronic components 24' populated on both sides 60, 62 of substrate 12', is illustrated. In several of the cross-sectional views, as shown in FIGS. 3a–3d, pallet 14' has at least one open cavity 64 to accommodate electronic components 24' that have been mounted on the first exposed surface 60 of substrate 12'. Open cavity 64 may be filled with a suitable foam 66, if necessary, to provide additional support for substrate 12'.

In a preferred embodiment of the present invention, substrate 12' is a polyester film having a thickness of 0.003 to 0.010 inches. Copper conductors 68 and solder pads 70 may be formed on both sides 60, 62 of the polyester substrate, as is well known in the art. A suitable solder mask (not shown) is applied over copper conductors 68 so that only the pad 70 areas on which solder paste 72 is to be printed are exposed. These pads 70 may have a suitable surface finish such as an organic surface finish to protect the pad surfaces from oxide formation. Other surface finishes such as immersion silver or electroplated tin may be used to enhance the solderability of components 24' to the pads.

Solder pastes 72 that have compositions containing lead, as well as solder pastes having lead-free compositions may be used. The solder pastes containing lead generally have a lower melting temperature of about 183° to 200° C., while lead-free solder compositions have melting temperatures of about 220° to 245° C.

In one embodiment of the present invention, pallet 14 or 14' having substrate 12 or 12' affixed thereon is transported through the pre-heat zones in oven 13, the solder paste 72 is activated and gradually heated to just below its melting temperature. During this process, the phase-transition material 42 begins to absorb heat from the oven 13 as well as from the substrate 12 or 12', and thereby lowers the temperature of the substrate. The phase transition material 42 is selected having a melting point that is lower than the melting point of the solder paste 72. As the phase-transition material 42 begins to melt, the material begins to absorb an amount of heat or energy equal to the latent heat of the material. Consequently, the temperature of phase-change material 42 is held constant until the material is fully melted. Thus, the present invention significantly enhances the heat absorption properties of the pallet 14 or 14' and maintains a lowered substrate 12 or 12' temperature during reflow of the solder paste 72.

In a preferred embodiment of the present invention, phase-transition material 42 exhibits a melting temperature lower than that of solder 72, and may be comprised of conductive metals such as gallium, gallium alloys, or alloys of tin and lead. Other suitable phase transition materials include chloro-fluoro carbons and their compounds.

In yet another embodiment of the present invention, supplemental heat source 18 located external of oven 18 (as shown in FIG. 1) is preferably a diode laser. The diode laser provides a focused and concentrated heat source in the form of a light beam 17. The substrate is transparent to the laser light and thus does not overheat and degrade. The solder paste 26, conductor pads 28, and copper regions of substrate preferable absorb heat because of their high thermal diffusivity, while substrate 12 or 12' is maintained at a lower temperature by the pallet 14 or 14', which is held at a lower temperature by the phase-transition material 42. In this manner, softening and damage to substrate 12 or 12' during the reflow process is prevented.

After the exposed region of the substrate passes below laser 18, the temperature of the exposed electronic component 24 and substrate 12 or 12' rapidly falls so that the activated solder cools and solidifies. A reliable electrical connection between the conductors or pads 20 and components 24 or 24' is thus formed. During this process, the phase-transition material 42 also solidifies, so that pallet 14 or 14' is ready for reuse.

In still another embodiment of the present invention, the substrate is not preheated in an oven. Another method for preheating the substrate may be used, such as passing the substrate under heat lamps. In other embodiments of the present invention, the substrate is not preheated at all. The light from diode laser 18 is sufficient to melt the solder paste.

Figure 4:
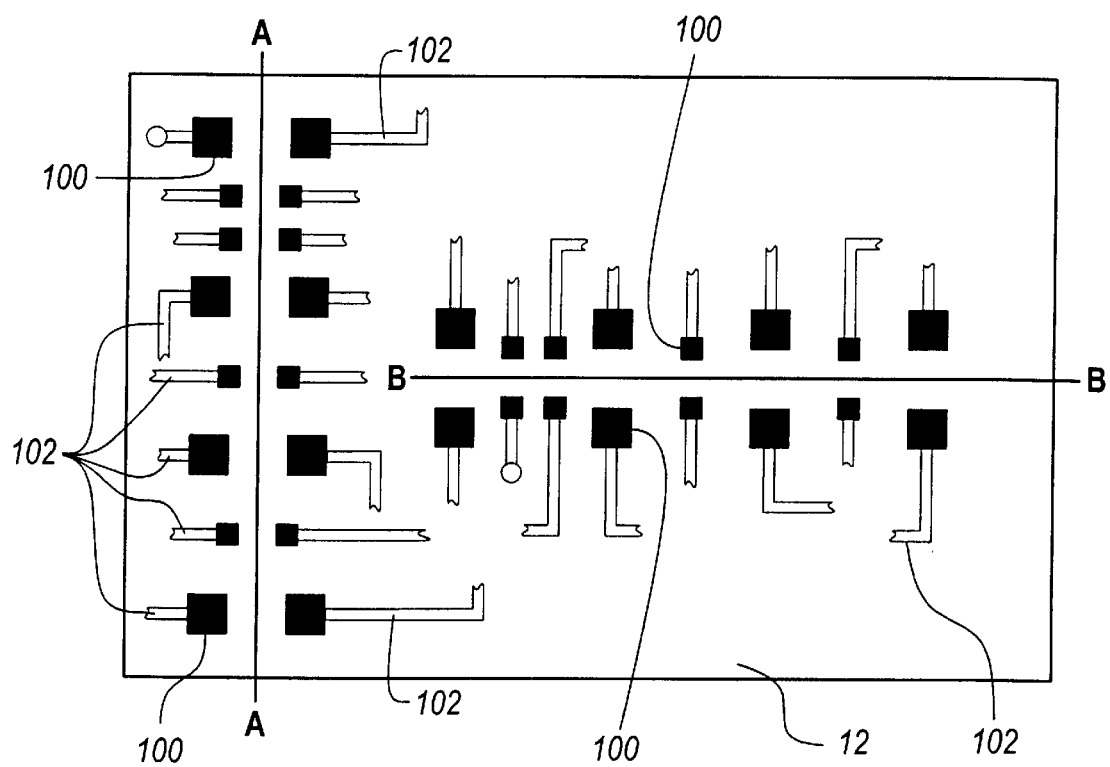
FIG. 4 is a plan view of a top surface of a flexible substrate having conductor paths disposed thereon, in accordance with the present invention.

A plan view of substrate 12 before populating the substrate with surface mount components is illustrated, in FIG. 4. As shown substrate 14 has a plurality of conductor pads 100 and conductive traces 102 configured to create electrical circuits, as well know in the art. Conductor pads 100 are adapted to receive surface mount electronic components. Preferably, conductor pads 100 are arranged along a common axis, such as axis (aa) or axis (bb). Of course, the present invention contemplates a plurality of axis similar to (aa) and/or (bb) on substrate 14. Solder paste (not shown) is applied over conductor pads 100 for electrically interconnecting surface components 110 (shown in FIG. 5) and the like to conductor pads 100 and substrate 12.

Figure 5:
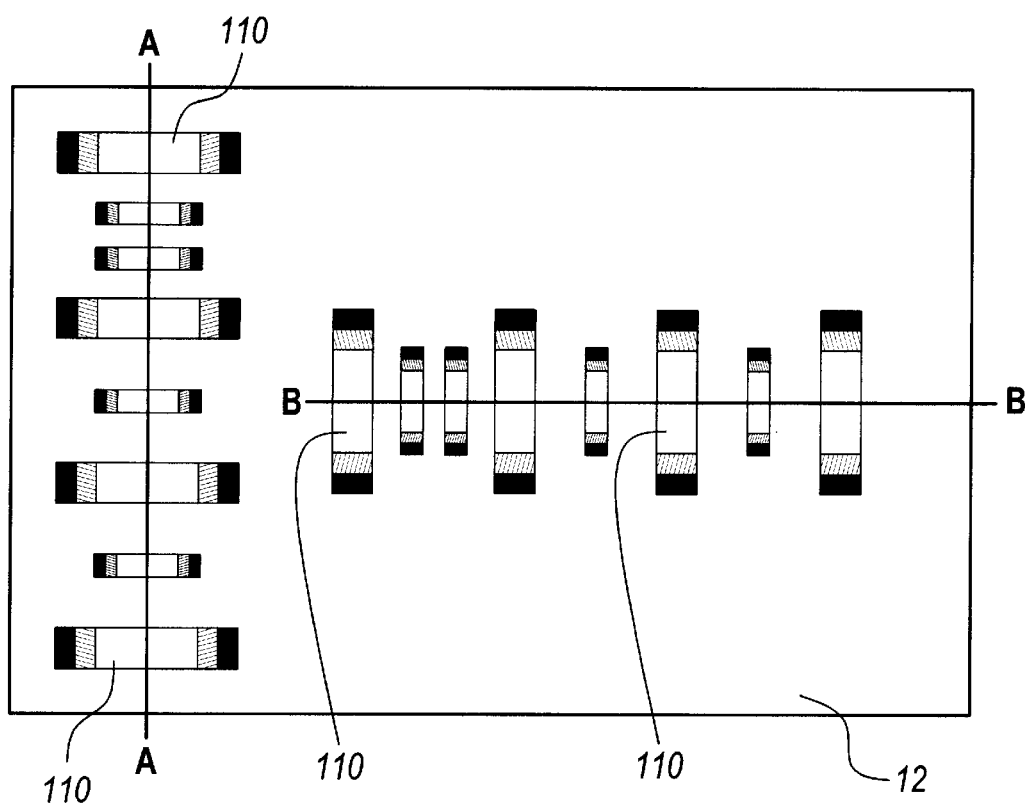
FIG. 5 is a plan view of a populated plastic substrate having surface mount components disposed thereon, in accordance with the present invention.

Referring now to FIG. 5, a plan view of substrate 12 is illustrated. Substrate 12 has arranged thereon, along axis aa and bb, a plurality of surface mount components 110. The surface mount components 110 are, advantageously, disposed on substrate 12 with the light or white colored surface facing the supplemental heat source 18 or laser. This arrangement of surface components on substrate 12 limits the heat absorption from the laser by the surface mount components, since the laser light is transparent to light colored objects.

Figure 6:
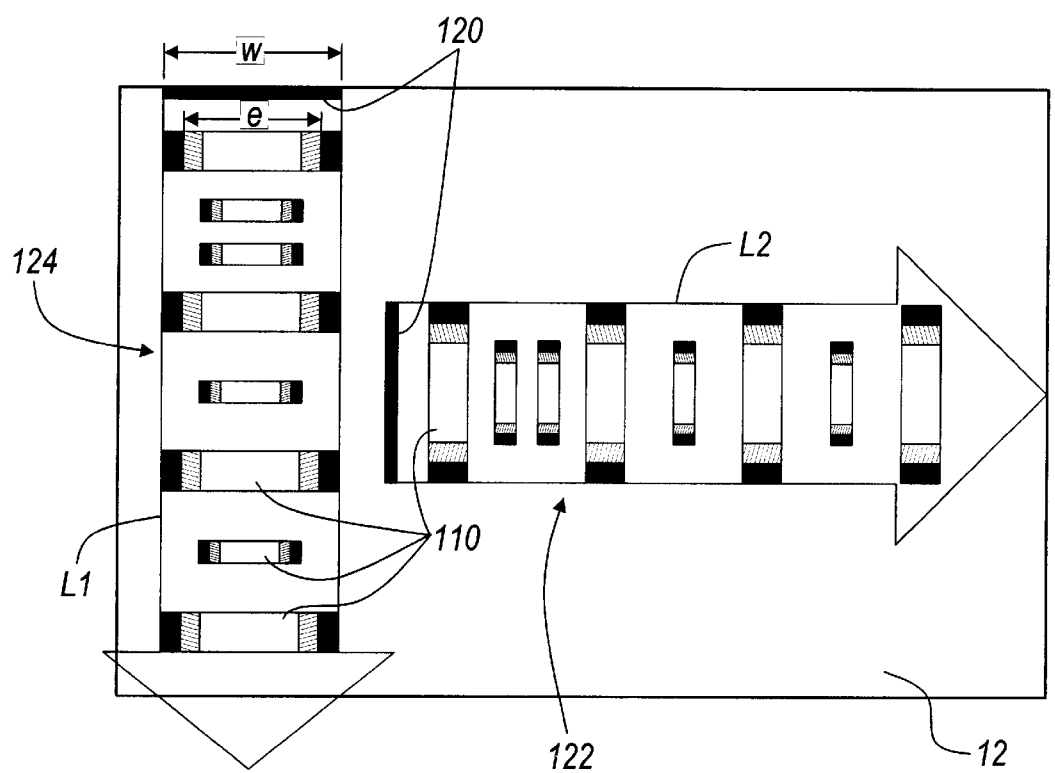
FIG. 6 is a plan view of a flexible substrate having electronic components disposed thereon and further indicating sweeping direction for a laser beam, in accordance with the present invention.

A laser sweep direction is illustrated in FIG. 6, wherein a plan view of substrate 12 populated with surface mount components 110. A laser beam 120 is positioned at one end of a row 122 or column 124 of surface mount components arranged along a common axis. The direction of the laser sweep is indicated for example in one instant by arrows (L1) and (L2) in another instance. Beneficially, the laser beam is rastered or swept across the substrate along the common axis. The laser beam has a width (w) that is at least as long as a length (l) of the longest surface mount components. This ensures that all the surface mount components are irradiated with the laser light. Moreover, the present invention improves manufacturing cycle times, since the laser beam is rastered along a common axis and does not have to be programmed to follow the individual placement of the surface mount components.

Figure 7:
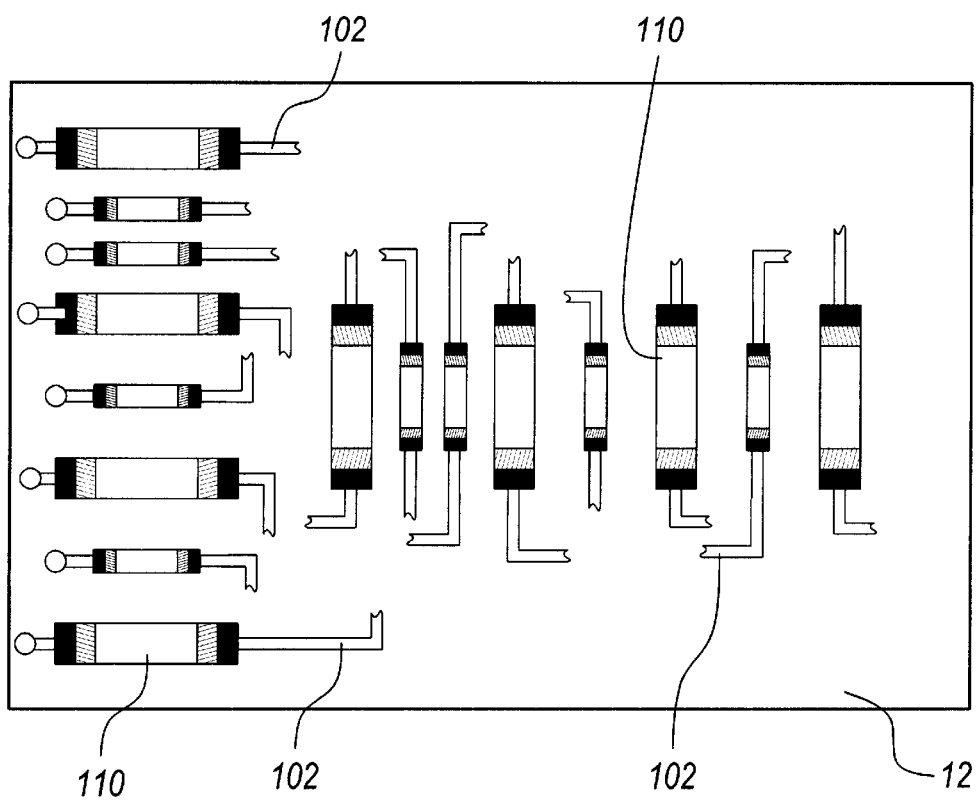
FIG. 7 is a plan view of a populated flexible substrate wherein the circuit component is disposed thereon have been electrically interconnected to the substrate using a diode laser, in accordance with the present invention.

With reference to FIG. 7, a plan view of a populated substrate 12 is illustrated. Substrate 12 is further shown with a plurality of surface mount components electrically interconnected to conductor pads. After the laser beam has been swept across the surface mount components along the common axis the solder paste disposed between the surface mount components and conductor pads is reflowed. Since the substrate is transparent to the laser light the temperature of the substrate not substantially elevated. The conductor pads and the contacts on the surface mount components absorb heat energy generated by the laser and act to liquefy the solder.

While the present invention has been particularly described in terms of the specific embodiments thereof, it will be understood that numerous variations of the invention are within the skill of the art and yet are within the teachings of the technology and the invention herein. Accordingly the present invention is to be broadly construed and limited only by scope ad spirit of the following claims.

What is claimed is:

1. A method for reflowing a solder dispersed between a plurality electrical circuit conductor pads attached to a flexible substrate and at least one electronic component using a laser, the method comprising:

aligning the plurality of electric circuit conductor pads along a common axis;

placing the at least one electronic component having a light colored surface side on a pair of the electrical circuit conductor pads wherein the light colored surface faces the laser; and sweeping the laser across a plurality of electronic components and conductor pads to reflow the solder without damaging the substrate.

2. The method of claim 1 further comprises raising the temperature of the substrate prior to sweeping the laser across the plurality of electronic components.

3. The method of claim 1 wherein the common axis is parallel with a longitudinal axis of the substrate.

4. The method of claim 3 further comprising sweeping the laser along the common axis parallel with the longitudinal axis of the substrate.

5. The method of claim 1 wherein the common axis is parallel with a transverse axis of the substrate.

6. The method of claim 5 further comprising sweeping the laser along the common axis parallel with the transverse axis of the substrate.

7. The method of claim 1 further comprising providing a laser beam spot having a length and width sufficient to cover the electrical circuit components.

8. A method for reflowing a solder dispersed between a plurality electrical circuit conductor pads attached to a flexible substrate and at least one electronic component using a laser, the method comprising:

aligning the plurality of electric circuit conductor pads along a common axis;

placing the at least one electronic component having a light colored surface side on a pair of the electrical circuit conductor pads wherein the light colored surface faces the laser;

raising a temperature of the substrate; and sweeping the laser across a plurality of electronic components and conductor pads to reflow the solder without damaging the substrate.

9. The method of claim 8 wherein the common axis is parallel with a longitudinal axis of the substrate.

10. The method of claim 9 further comprising sweeping the laser along the common axis parallel with the longitudinal axis of the substrate.

11. The method of claim 8 wherein the common axis is parallel with a transverse axis of the substrate.

12. The method of claim 11 further comprising sweeping the laser along the common axis parallel with the transverse axis of the substrate.

13. The method of claim 8 further comprising providing a laser beam spot having a length and width sufficient to cover the electrical circuit components.

14. A method for reflowing a solder dispersed between a plurality electrical circuit conductor pads attached to a flexible substrate and at least one electronic component using a laser, the method comprising:

aligning the plurality of electric circuit conductor pads along a common axis;

placing the at least one electronic component having a light colored surface side on a pair of the electrical circuit conductor pads wherein the light colored surface faces the laser;

raising a temperature of the substrate; and sweeping the laser, having a laser beam spot having a length and width sufficient to cover the electrical circuit components, across a plurality of electronic components and conductor pads to reflow the solder without damaging the substrate.

15. The method of claim 14 wherein the common axis is parallel with a longitudinal axis of the substrate.

16. The method of claim 15 further comprising sweeping the laser along the common axis parallel with the longitudinal axis of the substrate.

17. The method of claim 14 wherein the common axis is parallel with a transverse axis of the substrate.

18. The method of claim 17 further comprising sweeping the laser along the common axis parallel with the transverse axis of the substrate.

* * * * *